United States Patent [19]

Van Tran

[11] Patent Number: 5,285,481
[45] Date of Patent: Feb. 8, 1994

[54] RECEIVER CIRCUIT WITH SMART SQUELCH

[75] Inventor: Toan Van Tran, San Jose, Calif.

[73] Assignee: National Semiconductor Corporation, Santa Clara, Calif.

[21] Appl. No.: 775,741

[22] Filed: Oct. 15, 1991

[51] Int. Cl.[5] ............................................. H04B 1/10
[52] U.S. Cl. ................................... 375/103; 375/104; 375/5; 375/17; 307/58; 307/234; 328/111
[58] Field of Search ................... 375/17, 22, 104, 5; 307/234, 236, 331, 261, 265, 260, 268, 362, 510, 518, 228; 328/108, 111, 118

[56] References Cited

U.S. PATENT DOCUMENTS

| | | | |
|---|---|---|---|
| 3,686,438 | 8/1972 | Rousseau | 328/118 |
| 3,821,563 | 6/1974 | Warren | 307/234 |
| 3,863,244 | 1/1975 | Lichtblau | 328/108 |
| 4,078,204 | 3/1978 | Gauthier | 328/118 |
| 4,486,752 | 12/1984 | Chihak | 328/111 |

Primary Examiner—Curtis Kuntz
Assistant Examiner—Don N. Vo
Attorney, Agent, or Firm—Limbach & Limbach

[57] ABSTRACT

A receiver circuit relies on four novel pulse width timer/integrators to filter input data signals having a frequency less than a preselected maximum and greater than a preselected minimum. The circuit also rejects a single sine wave cycle. If an input pulse greater than a preselected maximum pulse width is encountered during data reception, then reception activity is terminated. A preferred embodiment of the receiver circuit implements IEEE 802.3 10 Base-T Ethernet receiver requirements utilizing a unique pulse width timer design.

5 Claims, 2 Drawing Sheets

RECEIVER CIRCUIT WITH SMART SQUELCH

BACKGROUND OF THE INVENTION

1. Field of the Invention

The present invention relates to semiconductor integrated circuits and, in particular, to a highly sensitive receiver circuit with improved noise immunity. A preferred embodiment of the input receiver implements IEEE 802.3 10Base-T Ethernet receiver requirements utilizing a unique pulse width timer design.

2. Discussion of the Prior Art

The IEEE 802.3 standard for 10Base-T Ethernet networks specifies a receiver filtering requirement for incoming data signals. According to the standard, the receiver must reject all signals that are not within the 2-15 MHz frequency range as well as all sine waves of single cycle duration. In addition, the receiver must be capable of recognizing the 200 ns Ethernet active-to-idle transition pulse as an End-of-Packet symbol, thereby terminating reception.

Conventional bandpass filters are not suitable for 10Base-T receiver applications because they do not reject single cycle data nor are they sensitive to the End-of-Packet pulse. In addition, bandpass filters are not amplitude-sensitive.

Therefore, it is necessary that a new receiver circuit be provided to meet 802.3 10Base-T Ethernet requirements.

SUMMARY OF THE INVENTION

The present invention provides a receiver circuit for filtering an incoming differential data signal. The receiver circuit includes a comparator that responds to the differential inputs by generating a positive output pulse when the difference in signal level between the differential inputs exceeds a preselected threshold level and by generating a negative output pulse when the difference in signal level is less than the preselected threshold level. A first pulse width timer generates an active positive pulse output signal when a positive output pulse has a pulse width greater than the selected minimum pulse width. The second pulse width timer generates an active negative pulse output signal when a negative pulse has a pulse width greater than the selected minimum pulse width. A first maximum pulse width timer monitors the first received pulse having a pulse width greater than the selected minimum pulse width to determine whether that pulse has a pulse width less than a preselected maximum pulse width. A second maximum pulse width timer determines whether a second received pulse, of polarity opposite to that of the first received pulse, has a pulse width less than the preselected maximum pulse width. Trigger logic responds to the first received pulse and to a third received pulse of the same polarity as the first received pulse by generating a receive data output signal that enables data reception. A reset timer responds to a pulse having a pulse width greater than a preselected maximum termination pulse width by generating a reset signal that resets the timers and cancels the receive data output signal.

The present invention also provides a pulse width timer circuit that includes a charge storage element connected between a reference voltage and a switching node. A first comparator receives an input voltage at its non-inverting input and a reset voltage at its inverting input. If the difference between the two is greater than zero, then the comparator provides a positive voltage signal; if the difference between the two is less than zero, then the comparator provides a negative voltage signal. The positive voltage signal drives a switch connected between the circuit's positive supply and the switching node. The negative voltage signal drives a switch connected between the switching node and ground. Thus, the complementary positive and negative voltage signal outputs of the comparator control the charging and discharging of the switching node. The switching node is connected to the non-inverting input of a second comparator, the inverting input of which is connected to receive the reference voltage plus a small differential voltage. Thus, if the switching node is charged such that the difference between the node voltage at the switching node and the reference-plus-differential voltage is greater than zero, then the second comparator generates an active output signal. In addition to serving as a data reception enable signal, the active output signal also serves as a latching signal for the first comparator.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Although the present invention is described below with reference to specific requirements of the 10Base-T Ethernet standard, it should be evident that these requirements are merely for illustrative purposes and are not intended to limit the scope or application of the invention.

Figure 1:
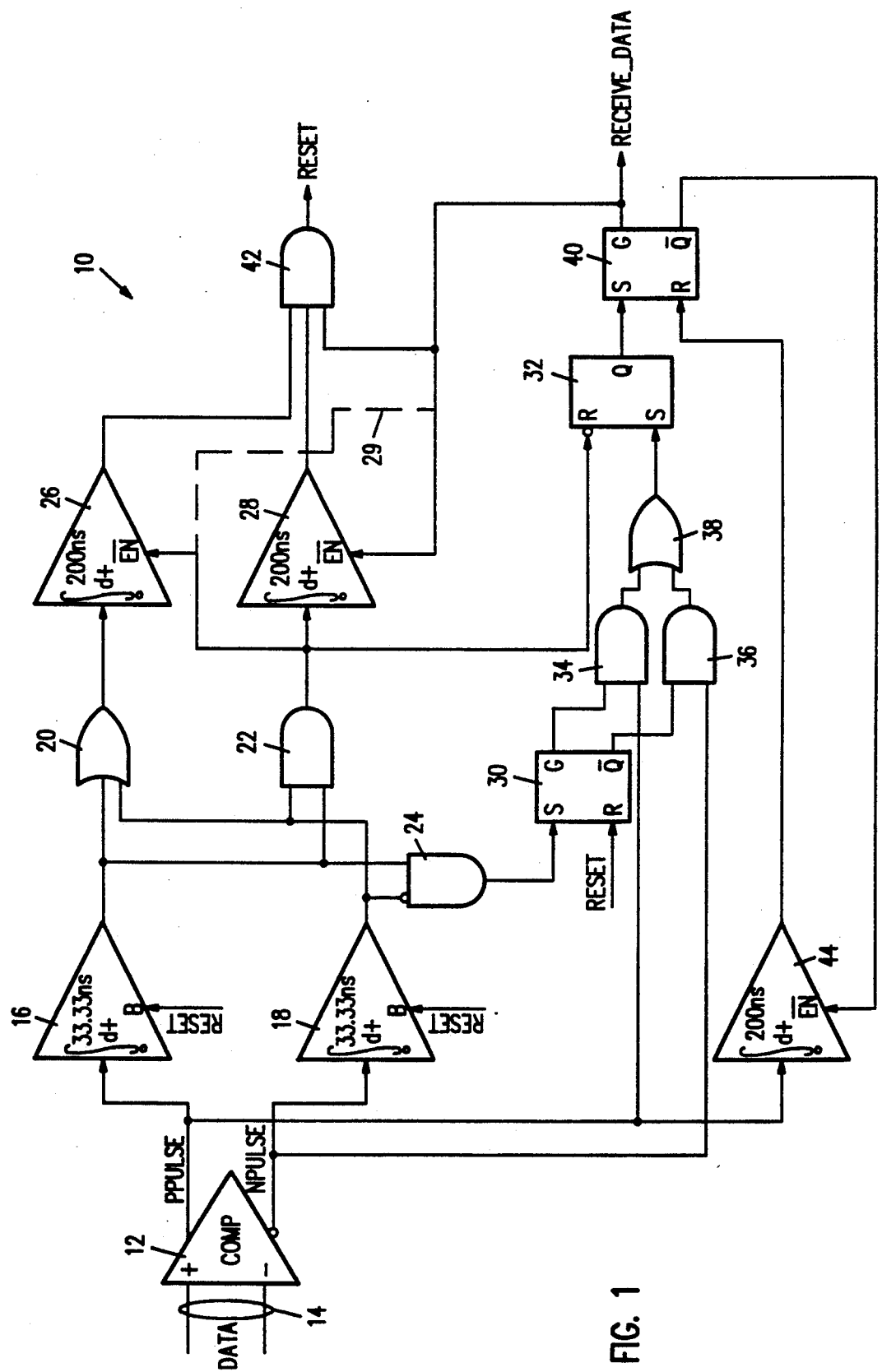
FIG. 1 is a logic diagram illustrating a receiver circuit in accordance with the present invention.

FIG. 1 shows a receiver circuit 10 that forms a bandpass filter that is based on four pulse width timer/integrators 16, 18, 26 and 28. The illustrated circuit 10 filters out signals that are not within a defined frequency range (less than a minimum frequency of 2.5 MHz and more than a maximum frequency of 15 MHz) The circuit 10 accepts data only if it is at least 1.5 cycles long. If a positive pulse greater than a selected maximum pulse width (e.g., 200 ns in the FIG. 1 embodiment) is encountered, then reception activity is terminated.

The receiver circuit 10 includes an input comparator 12 that receives an incoming differential data signal from the two lines of a twisted pair cable 14 at its non-inverting (+) and inverting (−) inputs. If the difference in signal level between the differential inputs of the comparator 12 exceeds the positive threshold of comparator 12, then comparator 12 provides a positive output pulse PPULSE to pulse width timer 16. If the difference in signal level between the differential inputs is less than the negative threshold of comparator 12, then comparator 12 provides a negative output pulse NPULSE to pulse width timer 18.

Thus, when incoming data is being received by comparator 12, comparator 12 generates either a positive output pulse PULSE or a negative output pulse NPULSE. Timer 16 and timer 18 monitor positive output pulse PULSE and negative output pulse NPULSE, respectively, to determine whether the pulse width of the output pulses PPULSE and NPULSE are longer than a preselected minimum pulse width, e.g. 33.33 ns in FIG. 1 (or symbol period T>66.66 ns for frequency <15MHz).

The outputs of the two pulse width timers 16 and 18 are both provided to each of three logic gates: OR gate 20, AND gate 22 and AND gate 24. The output of OR gate 20 drives pulse width timer 26. The output of AND gate 22 drives pulse width timer 28. The output of AND gate 24 sets latch 30 which, in turn, sets latch 32 via a multiplexor that includes NAND gates 34 and 36 and OR gate 38. The data output of latch 32 sets output latch 40, which controls data reception.

The circuit 10 is reset by the output of AND gate 42 which is driven by the outputs of timers 26 and 28 and by the output of latch 40.

Together, timer 16 and timer 18 form a low pass filter having a 15 MHz cut-off point.

Whenever either a positive output pulse PPULSE or a negative output pulse NPULSE is received having a pulse width greater than 33 ns, OR gate 20 initiates timer 26 to determine whether the pulse width is less than 200 ns. When a second pulse is received, which must be of opposite polarity from the first pulse, AND gate 22 initiates timer 28 to determine whether its pulse width is less than 200 ns. Together, timer 26 and timer 28 form a high pass filter having a cut-off frequency greater than 2.5 MHz.

In the embodiment of the invention shown in FIG. 1, detection of the second received pulse stops timer 26 and initiates timer 28; detection of the third pulse, which must be of opposite polarity to that of the second pulse, stops timer 28. Those skilled in the art will appreciate that a number of timing mechanisms could be used to achieve the desired result. For example, the period of the input signal could be used to stop timers 26 and 28. Utilizing this approach, detection of the first pulse starts timer 26. Detection of the second pulse starts timer 28; timer 26 continues to run. Detection of the third pulse, which must be of opposite polarity to that of the second pulse, and, thus, indicative of the occurrence of a full signal cycle, stops both timer 28 and timer 26, as indicated by dashed line 29 in FIG. 1.

AND gate 24 detects the first arriving positive pulse and responds by setting latch 30. If a negative pulse arrives first, then latch 30 remains in the reset state.

Together, AND gate 24 and latch 30 "remember" the polarity of the first pulse so that only a third pulse having the same polarity as the first pulse passes through the 2:1 multiplexor formed by AND gates 34 and 36 and OR gate 38 to set latch 32.

Latch 32 is always in the reset state unless at least two pulses (i.e. one full cycle) are detected. Latch 32 is set by the third pulse.

As stated above, the output of latch 32 sets output latch 40, which generates a receive data output signal which enables data reception.

Latch 40 is reset when timer 44 identifies a positive End-of-Packet, i.e., a positive pulse PPULSE >200 ns, thereby terminating data reception.

The output Q of latch 40 resets timers 16, 18, 26 and 28.

Figure 2:
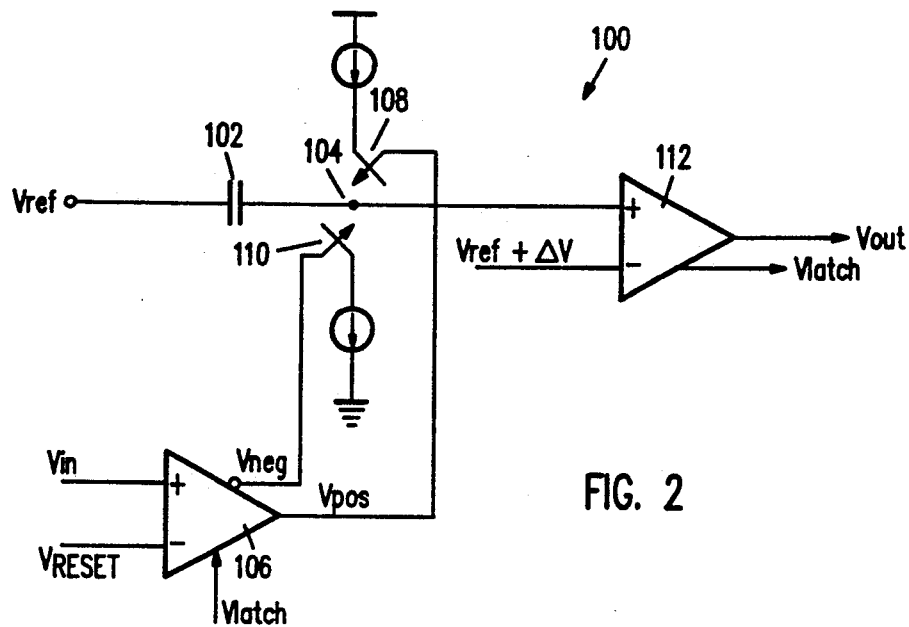
FIG. 2 is a logic diagram illustrating a pulse width timer circuit utilizable in the FIG. 1 receiver circuit.

FIG. 2 shows a logic representation of a pulse width timer circuit 100 utilizable in the above-described receiver circuit. Circuit 100 includes a capacitor 102 connected between a reference voltage Vref and a switching node 104. A comparator 106 receives an input voltage Vin at its non-inverting input and a reference voltage Vreset at its inverting input. Comparator 106 causes positive voltage output signal Vpos to be active when the difference between the input voltage Vin and the voltage of reset signal Vreset is greater than zero volts (Vneg provides the complement to Vpos). If the difference is less than zero volts, then the comparator 106 causes its negative voltage output signal Vneg to be active. The positive output voltage signal Vpos drives a charging switch 108 connected between the positive supply of circuit 100 and switching node 104. The negative voltage output signal Vneg drives a discharging switch 110 connected between switching node 104 and ground. Thus, when positive voltage output signal Vpos is active (Vneg inactive), switch 108 is closed and switch 110 is open, causing switching node 104 to charge. Conversely, when negative voltage output signal Vneg is active, switch 108 is open and switch 110 is closed, causing switching node 104 to discharge.

Switching node 104 is connected to the non-inverting input of a second comparator 112. The inverting input of comparator 112 is connected to the reference voltage Vref plus a differential voltage $\Delta V$, described below. Thus, when the switching node 104 is charged such that the difference between the switching voltage at node 104 and the reference-plus-differential voltage is greater than zero, comparator 112 provides outputs Vout and Vlatch.

The active output Vlatch of comparator 112 is fed back to comparator 106 as a latching signal.

Figure 3:
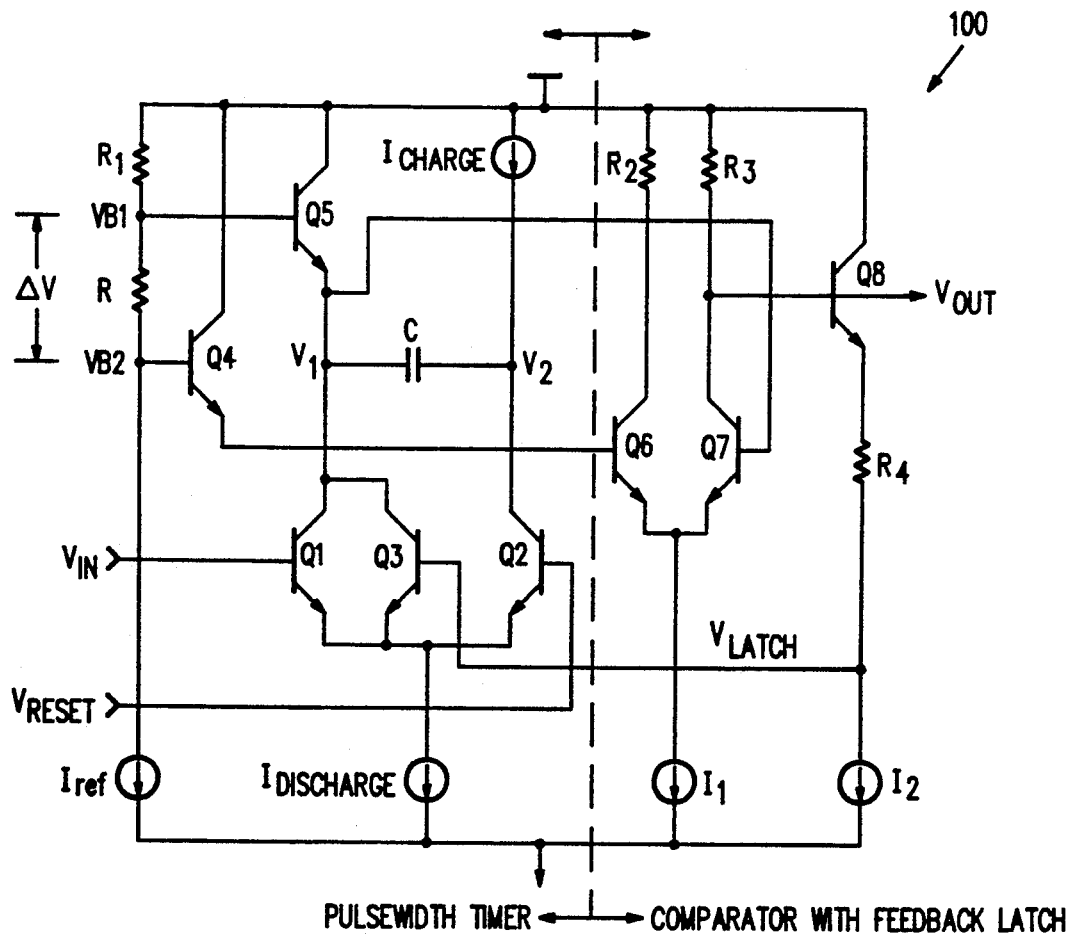
FIG. 3 is schematic diagram illustrating an embodiment of the FIG. 2 pulse width timer circuit.

FIG. 3 shows an embodiment of a circuit 100 that is consistent with FIG. 2 and utilizable in the implementation of the five pulse width timers 16, 18, 26, 28 and 44 in the FIG. 1 receiver circuit 10.

In the pulse width timer circuit 100, the pulse width of the input signal Vin is measured and captured using a feedback system so that the output Vout of the circuit 110 does not change when the input signal Vin is removed.

As shown in FIG. 3, when reset signal Vreset is low and a pulse is received at the Vin input node, npn input transistor Q1 is on and npn transistor Q2 is off. Therefore, current supply I-charge charges capacitor C up from Vb2 minus the base/emitter voltage Vbe of npn transistor Q4 to Vb1 minus the Vbe of npn transistor Q5, or $Delta\ V = Vb1 - Vb2$ $= R\ Iref$ The pulse width timing is set by $dt = C\ dV/Icharge$ $= C\ R\ Iref/Icharge$ When the voltage at node V2 is charged up to equal the voltage at node V1, npn transistor Q6 begins to conduct and npn transistor Q7 begins to turn off. When transistor Q7 is completely turned off, i.e. (V2−V1) is greater than 0V, the output signal Vout goes high and feedback signal Vlatch rises up. When feedback signal Vlatch rises to equal the high level of input signal Vin, it turns transistor Q3 on, keeping transistor Q2 off.

Thus, output signal Vout remains high even when the input signal Vin goes away.

To reset the circuit 100, reset signal Vreset is brought high (higher than the level of the feedback signal Vlatch), causing transistor Q2 to conduct. Thus, capacitor C is discharged and the voltage at node V2 goes down. When the voltage at node V2 falls to less than the voltage at node V1, transistor Q6 turns off and transistor Q7 turns on, causing the feedback signal Vlatch to go low, resetting the circuit 100. Node V2 is clamped at Vb2−Vbe(Q4).

To guarantee that the reset always works, the discharge current I-discharge must be greater than the charge current I-charge.

It should be understood that various alternatives to the embodiment of the invention described herein may be employed in practicing the invention. It is intended that the following claims define the scope of the invention and that apparatus and methods within the scope of these claims and their equivalents be covered thereby.

What is claimed is:

1. A receiver for filtering an incoming data signal that includes first and second differential inputs, the receiver circuit comprising;
   (a) a comparator that responds to the differential inputs by generating a positive output pulse when the difference in signal level between the differential inputs exceeds a preselected positive threshold level and by generating a negative output pulse when the difference in signal level is less than a preselected negative threshold level;
   (b) a first pulse width timer connected to receive positive output pulses from the comparator and that generates an active positive pulse output signal when a positive output pulse has a pulse width greater than a selected minimum pulse width;
   (c) a second pulse width timer connected to receive negative output pulses from the comparator and that generates an active negative pulse output signal when a negative pulse has a pulse width greater than the selected minimum pulse width;
   (d) first maximum pulse width timer means connected to the first and second pulse width timers for generating a first active long pulse output signal if a first received pulse, which may be either an active positive pulse output signal or active negative pulse output signal, has a pulse width less than a preselected maximum pulse width;
   (e) second maximum pulse width timer means connected to the first and second pulse width timers for generating a second active long pulse output signal if a second received pulse, received subsequent to and of opposite polarity with respect to the first received pulse, has a pulse width less than the preselected maximum pulse width; and
   (f) receive data trigger means responsive the first received pulse and to a third received pulse of the same polarity as the first received pulse for generating a receive data output signal.

2. A receiver circuit as in claim 1 and further comprising a reset timer responsive to an end-of-packet pulse having a pulse width greater than the maximum pulse width for generating a reset signal that cancels the receive data output signal.

3. A receiver circuit as in claim 1 wherein the selected minimum pulse width is 33.33 ns.

4. A receiver circuit as in claim 1 wherein the preselected maximum pulse width is 200 ns.

5. A pulse width timer circuit comprising:
   (a) charge storage means connected between a reference voltage and a switching node;
   (b) first comparator means responsive to an input voltage received at one of its input nodes and to a reset voltage received at another of its input nodes for providing a positive voltage signal if a difference between the input voltage and the reset voltage is greater than zero and for providing a negative voltage signal if the difference between the input voltage and the reset voltage is less than zero;
   (c) second comparator means responsive to a node voltage received from the switching node at one of its inputs and to a reference-plus-differential voltage received at another of its nodes for providing an active output signal if the difference between the node voltage and the reference-plus-differential voltage exceeds a second threshold level, the active output signal being provided to the first comparator means as a latching signal;
   (d) first switching means connected between a supply voltage and the switching node and responsive to the positive voltage signal for charging the switching node; and
   (e) second switching means connected between the switching node and ground and responsive to the negative voltage signal for discharging the switching node.

* * * * *

UNITED STATES PATENT AND TRADEMARK OFFICE
CERTIFICATE OF CORRECTION

PATENT NO. : 5,285,481
DATED : FEBRUARY 8, 1994
INVENTOR(S) : TOAN VAN TRAN

It is certified that error appears in the above-indentified patent and that said Letters Patent is hereby corrected as shown below:

IN THE CLAIMS:

In Col. 5, line 23, after "receiver" insert --circuit--.

Signed and Sealed this

Fourteenth Day of June, 1994

Attest:

BRUCE LEHMAN

*Attesting Officer*  *Commissioner of Patents and Trademarks*